(12) United States Patent
Fronczkiewicz et al.

(10) Patent No.: US 10,175,580 B2
(45) Date of Patent: Jan. 8, 2019

(54) METHOD FOR PRODUCING A FLEXOGRAPHIC PRINTING FRAME THROUGH MULTIPLE EXPOSURES USING UV LEDS

(71) Applicant: Flint Group Germany GmbH, Stuttgart (DE)

(72) Inventors: Peter Fronczkiewicz, Lake Wylie, SC (US); Thorben Wendland, Renningen (DE); Matthias Beyer, Pfinztal (DE)

(73) Assignee: Flint Group Germany GmbH, Stuttgart (DE)

( * ) Notice: Subject to any disclaimer, the term of this patent is extended or adjusted under 35 U.S.C. 154(b) by 0 days.

(21) Appl. No.: 15/536,565

(22) PCT Filed: Dec. 16, 2015

(86) PCT No.: PCT/EP2015/079930
§ 371 (c)(1),
(2) Date: Jun. 15, 2017

(87) PCT Pub. No.: WO2016/096945
PCT Pub. Date: Jun. 23, 2016

(65) Prior Publication Data
US 2018/0004093 A1    Jan. 4, 2018

(30) Foreign Application Priority Data
Dec. 17, 2014   (EP) .................................... 14198604

(51) Int. Cl.
*G03F 7/32* (2006.01)
*G03F 7/36* (2006.01)
(Continued)

(52) U.S. Cl.
CPC ............... *G03F 7/36* (2013.01); *G03F 7/027* (2013.01); *G03F 7/201* (2013.01); *G03F 7/202* (2013.01);
(Continued)

(58) Field of Classification Search
CPC ....................................................... B41C 1/10
See application file for complete search history.

(56) References Cited

U.S. PATENT DOCUMENTS 3,264,103 A    8/1966   Cohen et al.
5,061,606 A    10/1991  Telser et al.
(Continued)

FOREIGN PATENT DOCUMENTS

DE    102010031527 A1 *  1/2012   ............... G03F 1/68
DE    102010031527 A1     1/2012
(Continued)

OTHER PUBLICATIONS

International Preliminary Examination Report with Applicant response (in German) for PCT/EP2015/079930 dated Dec. 7, 2016.
(Continued)

*Primary Examiner* — Chanceity N Robinson
(74) *Attorney, Agent, or Firm* — Drinker Biddle & Reath LLP

(57) ABSTRACT

A method for producing flexographic printing plates. The method has the following steps:
(a) producing a mask by imaging the digitally imagable layer,
(b) exposing the photopolymerizable, relief-forming layer through the mask with actinic light, and photopolymerizing the image regions of the layer, and
(c) developing the photopolymerized layer by washing out the unphotopolymerized regions of the relief-forming layer with an organic solvent, or by thermal development, wherein
(Continued)

step (b) contains at least two exposure cycles with actinic light with an intensity of 100 to 5000 mW/cm$^2$ from a plurality of UV-LEDs, the energy input into the photopolymerizable, relief-forming layer per exposure cycle being 0.1 to 5 J/cm$^2$.

11 Claims, 5 Drawing Sheets

(51) Int. Cl.
  *G03F 7/027* (2006.01)
  *G03F 7/20* (2006.01)
(52) U.S. Cl.
  CPC ............ *G03F 7/203* (2013.01); *G03F 7/2004* (2013.01); *G03F 7/2016* (2013.01); *G03F 7/325* (2013.01); *G03F 7/32* (2013.01)

(56) References Cited

U.S. PATENT DOCUMENTS

| | | | |
|---|---|---|---|
| 5,175,072 A | 12/1992 | Martens | |
| 5,262,275 A | 11/1993 | Fan | |
| 8,492,074 B2 | 7/2013 | Bryant | |
| 8,578,854 B2 | 11/2013 | Sievers | |
| 8,772,740 B2 | 7/2014 | Klein et al. | |
| 8,808,968 B2 | 8/2014 | Choi et al. | |
| 2009/0186308 A1 | 7/2009 | Rudolph | |
| 2010/0143840 A1 | 6/2010 | Veres et al. | |
| 2011/0104615 A1 | 5/2011 | Sievers | |
| 2013/0017493 A1 | 1/2013 | Cook et al. | |
| 2013/0242276 A1* | 9/2013 | Schadebrodt | G03F 1/68 355/27 |
| 2014/0057207 A1 | 2/2014 | Baldwin | |

FOREIGN PATENT DOCUMENTS

| | | |
|---|---|---|
| EP | 332070 A2 | 9/1989 |
| EP | 433374 A1 | 6/1991 |
| EP | 654150 B1 | 3/1997 |
| EP | 1069475 A1 | 1/2001 |
| EP | 1070989 A1 | 1/2001 |
| EP | 1072953 A1 | 1/2001 |
| WO | WO-9002359 A1 | 3/1990 |
| WO | Wo-9614603 A1 | 5/1996 |
| WO | WO-0188615 A1 | 11/2001 |
| WO | WO-2008135865 A2 | 11/2008 |
| WO | WO-2012010459 A1 | 1/2012 |
| WO | WO-2014035566 A1 | 3/2014 |

OTHER PUBLICATIONS

International Search Report for PCT/EP2015/079930 dated Mar. 14, 2016.
English Translation of International Preliminary Report on Patentability for International Application No. PCT/EP2015/079930, dated Jun. 22, 2017.

* cited by examiner

METHOD FOR PRODUCING A FLEXOGRAPHIC PRINTING FRAME THROUGH MULTIPLE EXPOSURES USING UV LEDS

CROSS-REFERENCE TO RELATED APPLICATIONS

This application is a national stage application (under 35 U.S.C. § 371) of PCT/EP2015/079930, filed Dec. 16, 2015, which claims benefit of European Application No. 14198604.2, filed Dec. 17, 2014, both of which are incorporated herein by reference in their entirety.

The invention relates to a method for producing flexographic printing plates by multiple exposure with UV-LEDs.

The most widespread method for producing flexographic printing plates involves the imagewise exposure of the photopolymerizable, relief-forming layer with actinic radiation, especially longwave UV radiation, through a mask produced digitally or photographically. In a further method step, the exposed layer is treated using a suitable solvent or solvent mixture, with the unexposed, unpolymerized regions of the relief-forming layer being dissolved, while the exposed, polymerized regions are retained and form the relief of the printing plate.

Digital imaging of photosensitive flexographic printing elements is known in principle. In this context, flexographic printing elements are not produced conventionally, by placement of a photographic mask, followed by exposure through the photographic mask. Instead, the mask is produced in situ directly on the flexographic printing element by means of appropriate technologies. Flexographic printing elements may be provided, for example, with opaque, IR-ablative layers (EP-B 654 150, EP-A 1 069 475) which can be ablated imagewise by means of IR lasers. Other known technologies include layers which can be written by means of inkjet technology (EP-A 1 072 953), or layers which can be written thermographically (EP-A 1 070 989). Following the imagewise writing of these layers by means of the technologies appropriate for the purpose, the photopolymerizable layer is exposed through the resultant mask by means of actinic light.

Imagewise exposure with actinic radiation takes place on a standard basis using UV radiation sources which possess significant emission in the range from about 315 nm to 420 nm (longwave UV region to violet region of the visible spectrum). The most frequently used radiation source are UV/A tubes, which possess an emission maximum at a wavelength of about 370 nm and generate UV intensities of 10 mW/cm$^2$-30 mW/cm$^2$, measured at a distance of 50 mm (typical distance from the radiation source to the surface of the flexographic printing element). UV/A tubes of this kind are available for example under the "R-UVA TL 10R" designation from Philips. Use is also made, moreover, of mercury vapour lamps for the imagewise exposure, with preference being given to doped medium-pressure mercury vapour lamps, since doping with iron and/or gallium allows an increase in the fraction emitted in the UV/A region.

Recently, for the radiation curing of photopolymerizable compositions, there is also increasing use of LEDs (light emitting diodes) which emit UV light.

Common LED systems for UV curing are focused presently in practice on the wavelengths 395 nm and also 365 nm. Other possible spectral ranges are 350 nm, 375 nm, 385 nm, and 405 nm. Scientific publications additionally mention the wavelengths 210, 250 nm, 275 nm, and 290 nm. LEDs are distinguished by a narrow intensity distribution (typically +/−10-20 nm). They have no significant warm-up phase and can be regulated to about 10% to 100% of the maximum intensity.

Using UV light-emitting diodes it is possible to achieve power levels of a few watts/cm$^2$, and the efficiency, depending on UV LED system, is between 1% and 20%. Here it is possible to apply the following rough rule of thumb: the shorter the wavelength, the lower the efficiency. And the shorter the intended emission wavelength, the higher the production costs. At the present time, LED systems for areal curing are available commercially with a wavelength of 395 nm and a UV power between 1-4 W/cm$^2$, and with a wavelength of 365 nm in the 0.5-2 W/cm$^2$ range, from various suppliers.

WO 2008/135865 describes a method comprising the positioning of a printing plate with photocrosslinkable material on an imaging unit, the imaging of the plate in accordance with image data, the application of UV radiation from a plurality of UV-emitting diodes for crosslinking the photocrosslinkable material on the plate during the imaging of the printing plate, where the printing plate may be a photopolymerizable flexographic printing plate, a photopolymerizable letter press printing plate, or a photopolymerizable sleeve. Additionally described is the removal of the plate from the imaging unit and its subsequent exposure from the reverse or from the front and optionally also from the reverse, with UV radiation from a plurality of UV-emitting diodes.

During the exposure of photopolymer plates with UV light through a mask produced by laser ablation, an unwanted effect which occurs is the inhibition of the polymerization as a result of oxygen, which diffuses into the photopolymer layer from the surrounding atmosphere. The same effect occurs if a layer imagable digitally by means of other technologies is employed, since these layers are generally only a few micrometers thick and hence are sufficiently thin that the oxygen from the ambient air is able to diffuse through them.

Flexographic printing plates are used for the printing of various substrates (film, foil, paper, cardboard, corrugated board). This usually involves using highly fluid printing inks based on alcohol or water, or UV printing inks.

A typical feature of flexographic printing is the squeezing of the highly fluid printing ink beyond the edges of the relief elements. This effect is unwanted, since it leads to an increase in tonal value in the print. This increase in tonal value reduces the contrast of image reproduction and thus diminishes the quality of the printed image.

In recent times there have been a number of developments aimed at raising flexographic print quality by means of what are called Flat-Top-Dots (FTDs). While usual flexographic printing plates that can be processed digitally are exposed under the influence of atmospheric oxygen, with the FTD processes, attempts are made to shut out the disruptive influence of the oxygen on the crosslinking reaction, in order to allow even finer image elements to be reproduced and hence increases to be achieved in resolution, contrast and ink opacity.

One possibility of shutting out atmospheric oxygen during exposure is to carry out exposure under nitrogen, for example, as described in US 2009/0186308. In other processes, a film or other oxygen barrier layer is laminated on before surface UV exposure, thereby preventing subsequent diffusion of the oxygen, as described in US 2013/0017493. The barrier layer may also be integrated into the construction of the flexographic printing plate, as described in U.S. Pat. No. 5,262,275 or in U.S. Pat. No. 8,492,074, for example. Or photopolymerizable layers are described comprising additives which shut out the effect of the oxygen on the crosslinking reaction, as described in U.S. Pat. No. 8,808,968.

In all of the processes stated it is possible to reproduce relatively fine details on the flexographic printing plate. In contrast to exposure under atmospheric oxygen, where rounded halftone dots are formed (known as round-top dots, RTDs), the FTD processes form halftone dots with a planar surface and pronounced edges. It is possible accordingly to image finer halftone dots and also high-resolution surface structures, which enhance ink transfer, on the printing plate.

As the FTD processes become more widespread, however, the inherent disadvantages of these technologies in printing are also becoming apparent. In printing, FTD plates often exhibit the effect known as dot bridging. This is how the skilled person identifies the irregular convergence of the ink between individual halftone dots in the middle-tone area, which is unacceptable in practice. The cause of dot bridging is as yet unresolved. The effect may be lessened by changing the viscosity of the printing ink, or shifting to higher tonal value areas, but the disruptive effect cannot be eliminated entirely. A connection with the sharply defined edges of the FTD printing plates, however, is very likely, since RTD printing plates, exposed under oxygen, do not display this effect.

One elegant FTD process is the exposure of the flexographic printing plate by means of high-energy UV-LED radiation. In this process, the oxygen is not eliminated, but its inhibiting effect is minimized by the exposure using high-energy radiation.

WO 2012/010459, for example, describes the combined exposure of a flexographic printing plate by means of high-energy UV-LED radiation, followed by exposure with conventional UV tubes. Exposure in a flat embodiment is described. For economic reasons, however, it would be desirable to be able to use one radiation source.

US 2011/0104615 describes the process of UV-LED exposure preferably on a drum exposure unit, on the side of which there is mounted a UV-LED strip which moves parallel to the axis of the drum while the drum is rotating. The rotational speed of the drum and hence the energy input per exposure cycle can be varied. Through choice of the speed of rotation, the operator is able to control whether round or flat halftone dots are produced on the flexographic printing plate. At a speed of rotation of >60 revolutions per minute (rpm), round halftone dots are produced. Below 60 rpm, flat halftone dots are produced. The reason given for this effect is the diffusion of oxygen that takes place in the course of exposure. With a low exposure energy, the oxygen present in or diffusing subsequently into the photopolymerizable layer is sufficient to terminate the crosslinking reaction. RTDs are produced. At higher doses of energy, the chain initiating reaction by radical formation is very much quicker than the chain termination reaction, and so the effect of the oxygen is hardly manifested at all anymore. FTDs are produced.

Also described is a flat embodiment of the UV-LED exposure, in which the UV-LED exposure unit is guided back and forth across the width of the printing plate, while the printing plate is displaced in the longitudinal direction. US 2011/0104615, though, says nothing about how the exposure operation must be controlled in order to produce FTD plates having optimum printing properties.

U.S. Pat. No. 8,772,740 describes how both FTDs and RTDs can be generated on a printing plate by means of UV-LED exposure. In this case, the printing plate is written with a laser a first time and is then exposed so as to form FTDs. The printing plate is then written a second time with a laser and subsequently exposed so as to form RTDs. The process, however, is very costly and inconvenient, and has therefore not become established in practice.

In U.S. Pat. No. 8,578,854, the UV-LED exposure of flexographic printing plates is described, where the UV-LED exposure unit is located in a reflector tunnel. In the reflector tunnel, the UV-LED radiation is additionally scattered, allowing halftone dots with better anchoring. The process can be implemented for flat and round print forms. The document does not reveal how exposure is to be controlled in order to eliminate problems such as dot bridging.

Lastly, WO 2014/035566 describes a flexographic printing plate which is exposed using UV-LEDs, the exposure taking place with two different wavelengths (365 nm and 395 nm). This type of exposure is said to make it possible to control anchoring, and the flank angle of the halftone dots, in order to achieve a good print outcome. Exposure by means of two UV-LED strips, however, is expensive. The document does not reveal how the problem of dot bridging in halftone printing can be eliminated.

It is an object of the invention to provide an inexpensive method for producing flexographic printing plates that remedies the drawbacks of the prior art. A particular object of the invention is to provide a method with which laser-imagable flexographic printing plates can be processed by UV-LED exposure to form printing FTD plates which permit high resolution and hence high contrast of the printed image and good ink transfer by surface structures, without the typical negative appearance features of the FTD plates such as formation of ink bridges in halftone printing (the phenomenon known as dot bridging).

The object is achieved by a method for producing flexographic printing plates, using as starting material a photopolymerizable flexographic printing element which at least comprises, arranged one atop another, a dimensionally stable support, and
at least one photopolymerizable, relief-forming layer, at least comprising an elastomeric binding, an ethylenically unsaturated compound, and a photoinitiator,
a digitally imagable layer,
and the method comprises at least the following steps:
(a) producing a mask by imaging the digitally imagable layer,
(b) exposing the photopolymerizable, relief-forming layer through the mask with actinic light, and photopolymerizing the image regions of the layer, and
(c) developing the photopolymerized layer by washing out the unphotopolymerized regions of the relief-forming layer with an organic solvent, or by thermal development,
characterized in that step (b) comprises two or more exposure cycles (b-1) and (b-n) with actinic light with an intensity of 100 to 10000 mW/cm$^2$ from a plurality of UV-LEDs, the energy input into the photopolymerizable, relief-forming layer per exposure cycle being 0.1 to 5 J/cm$^2$.

A BRIEF DESCRIPTION OF THE FIGURES

Figure 1:
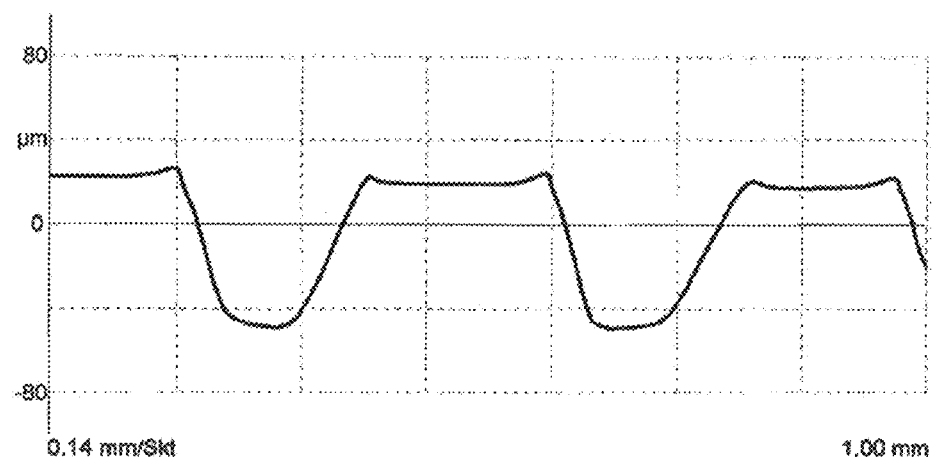
FIG. 1 shows the result of the Perthometer measurement for a plate with pronounced cupping.

It has been found that in the exposure of the photopolymerizable layer with high exposure intensity by means of UV-LEDs, the phenomenon known as "cupping" of the halftone dots of the printing relief layer is minimized, and the depths between the halftone dots can be enlarged, if the overall exposure energy is introduced not in a single exposure step, but is instead distributed over a number of exposure cycles.

The energy input ($J/cm^2$) into the photopolymerizable layer in total is set according to the reactivity of the printing plate. Typical energies required for the crosslinking of a flexographic printing plate are in the range of 5-25 $J/cm^2$.

In one preferred embodiment of the invention, the overall energy input into the photopolymerizable, relief-forming layer in step (b) is 5 to 25 $J/cm^2$.

In accordance with the invention, this energy is not input into the photopolymerizable layer in one exposure step, but is instead distributed over a number of partial exposures (exposure cycles); preferably, at least 3 partial exposures are carried out.

In one embodiment of the invention, the energy input per exposure cycle remains constant over the total duration of the exposure step (b).

For example, 10 to 50 exposure cycles are carried out with an energy input of 0.1 to 1 $J/cm^2$.

In one preferred embodiment, the energy input per exposure cycle increases over the total time of the exposure step (b); in other words, a higher energy is input in a later exposure cycle than in an earlier exposure cycle.

In one preferred embodiment, a plurality of exposure cycles with low energy input are carried out first of all, and subsequently one or more exposure cycles with higher energy input.

For example, first 10 to 40 exposure cycles with an energy input of 0.1 to 1 $J/cm^2$ and then 1 to 5 exposure cycles with 2 to 5 $J/cm^2$ are carried out.

Generally speaking, the UV-LEDs used in step (b) have an emission maximum in the wavelength range of 350-405 nm, for example at 350 nm, 365 nm, 375 nm, 385 nm, 395 nm or 405 nm.

The individual exposure cycles (b-1) to (b-n) are realized preferably by moving the plurality of UV-LEDs parallel to the surface of the flexographic printing element. In this case the plurality of UV-LEDs is preferably arranged on one or more LED strips which are moved parallel to the surface of the flexographic printing element. In this case the LED strip or strips may be mobile or the LED strips may be fixed and the surface of the flexographic printing element may be mobile, or both possibilities may be realized.

In one embodiment of the invention, the plurality of UV-LEDs are arranged alongside one another on at least two UV-LED strips, of which at least one is mobile and at least one is fixed.

Generally speaking, the UV-LED strip is moved with a relative speed of 50 to 5000 mm/min parallel to the surface of the flexographic printing element.

The exposure steps (b) are performed preferably on an XY stage having a width X and a length Y, by means of one or more UV-LED strips, which are moved along the surface of the flexographic printing element. The UV-LED strip or strips typically extend over the width of the XY stage, thereby covering the entire width of the exposure unit. During exposure, the UV-LED strip is moved back and forth at variable speed a number of times in the longitudinal direction over the entire length of the printing plate. The length thereof may amount, for example, to 2 m. In one embodiment of the invention, exposure takes place only when the UV-LED strip is moved in one direction. In another embodiment of the invention, exposure takes place when the UV-LED strip is being moved in both directions (back and forth directions).

The power of the UV-LED strip is preferably in a range from 500 to 5000 $mW/cm^2$, more preferably in a range from 600 to 2000 $mW/cm^2$. This power is determined with a UVA meter in a distance of 10 mm between measuring sensor and protective window of the LED strip. For this purpose, the measurement sensor is positioned on the base plate of the exposure unit and the light-emitting UV-LED strip is run over the sensor, which records an intensity profile whose maximum corresponds to the exposure intensity. The luminous power irradiated at the surface of the flexographic printing element is lower when there is a greater distance between UV-LED strip and irradiated surface, and higher when there is a smaller distance between UV-LED strip and irradiated surface. The power (luminous intensity) irradiated at the surface of the flexographic printing element, in accordance with the invention, is 100 to 5000 $mW/cm^2$, preferably 500 to 5000 $mW/cm^2$, and more preferably 600 to 2000 $mW/cm^2$.

Possible wavelengths are 355 nm, 365 nm, 375 nm, 395 nm, and 405 nm; a preferred wavelength is 365 nm.

A typical UV-LED strip possesses a beam window width of about 10 mm and is constructed from linearly arranged LED arrays, consisting each of 4 LEDs in a square arrangement, this emitting a uniform luminous intensity over the entire length of the LED strip.

In a typical LED strip 1 m long, for example, there are a total of 125 LED arrays arranged, corresponding to 500 individual LEDs.

The UV-LED arrays may also be arranged in an offset manner in order to irradiate a greater area. In that case, however, the UV-LED strip must be fitted with mirrors, preferably at the sides, in order to ensure uniform illumination of the irradiated area.

The UV-LED strip typically irradiates light with a certain emission angle. Typical emission angles are in a range from 20 to 70 degrees; in the case of UV-LED strips of linear construction, they are in a range from 20 to 40 degrees. The width of the irradiated area element can be calculated from the beam window width, the emission angle and the distance of the LED strip from the surface of the printing plate.

The distance of the strip from the surface of the printing plate is usually 5 mm to 100 mm, preferably 5 to 30 mm.

With a typical UV-LED strip having a beam window width of about 10 mm, the width of the irradiated area element is in a range from 15 to 100 mm, or between 15 and 40 mm in the case of a small distance of about 10 mm from the plate surface.

The speed with which the UV-LED strip is moved relative to the surface of the flexographic printing element is in the range from 50 mm/min to 10 000 mm/min, preferably from 100 mm/min to 5000 mm/min.

In a further, preferred embodiment of the invention, the UV LED strip is moved back and forth in the exposure cycles with low energy input and is not switched off when run back into the starting position, and subsequently, in the exposure cycles with high energy input, is moved only in one direction, i.e. is switched off when run back into the starting position. By this means it is possible to achieve a substantial reduction in exposure time overall.

The irradiation time can be determined from the speed of the UV-LED strip relative to the plate surface and from the width of the irradiated area element of the plate surface. With the average power of the UV-LED irradiation, determined using a UVA measuring device, the energy input per exposure cycle can then be determined.

Thus, for example, with a UVA output from an LED exposure unit of 800 mW/cm², a width of the irradiated area element of 25 mm and a typical rate of advance of 250 mm/min, the irradiation time is 6 seconds and the energy input is 4.8 J/cm².

During the irradiation of flexographic printing plates by means of UV-LED strips within the stated power range, there may be local, severe heating of the printing plate. Particularly in the case of a slow operation and high power, temperatures of up to 80° C. may be reached in the printing plate for short periods. In order to limit the temperature increase, it is advantageous to provide an air knife for cooling between LED strip and printing plate surface. Furthermore, it ought to be possible to cool the baseplate of the exposure unit, in order to allow the heat generated by absorption and chemical reaction to be removed again quickly.

Of course, the UV-LED exposure of the invention in a plurality of partial exposure steps (exposure cycles) is not confined to embodiments in which the printing plate remains fixedly on the XY stage and the UVA-LED strip moves over it.

Particularly in an automatic plate processing system, in which the printing plate is transported at constant speed and undergoes the individual processing steps, the individual exposure cycles will be realized with a plurality of fixed UVA LED strips beneath which the plate passes.

In another variant, the printing plate will be transported at a constant speed, and the UVA-LED strip will be moved back and forth in the transport direction at a higher speed than the transport speed, in order to realize exposure cycles with low energy input. The UVA-LED strip will subsequently be moved into a stationary position at the end of the exposure section, in which an exposure cycle with higher energy input will be realized. Since the power of a UV-LED strip is almost infinitely regulatable, numerous variants are possible here.

Alternatively, the partial exposures with low energy may also be realized such that a UVA-LED strip is mounted longitudinally to the web direction and is moved back and forth, and at the end of the exposure section a second or third UVA-LED strip is then run through transverse to the transport direction.

The processes taking place in the printing plate during irradiation with UVA light are complex. A number of processes are running in parallel, and must be considered in three dimensions, in order to be able to explain and influence the development of the optimum halftone dot geometry for subsequent printing.

Following absorption of the UVA light, a photoinitiator molecule present in the printing plate breaks down into two radicals. The radicals produced react in a radical chain reaction with the low molecular mass crosslinker that is present in the printing plate. Since the crosslinker is polyfunctional, the polymerization results in the formation of networks, which cause insolubility in the exposed regions of the printing plate. The speed of the photopolymerization is generally very quick and is dependent in a first approximation on the concentration of the available crosslinker and of the available radicals.

Radical chain reactions are inhibited by the presence of oxygen, since oxygen scavenges reactive radicals and converts them into more stable radicals which are no longer available for further polymerization.

In the case of typical tube exposure, the printing plate is irradiated for a time of around 10 minutes with UVA light of low power (around 20 mW/cm²). At this low power, the rate of the chain initiation reaction is in the same order as the rate of the chain termination reaction. In the exposed regions of the printing plate, therefore, the termination reaction with oxygen proceeds as a competing reaction to the polymerization initiated by formation of radicals. Oxygen from the ambient air is able to diffuse subsequently at the surface of the printing plate. In the case of tube exposure, therefore, halftone dots on the surface of the printing plate are usually not imaged exactly, but instead have rounded dot surfaces. The skilled person refers to round-top dots (RTDs).

In the case of UV-LED exposure, higher radiation doses are input into the plate in a very much shorter time. In the case of a typical UV-LED exposure, the irradiated power is around 1000 mW/cm². At a customary irradiation width of about 30 mm and with rates of advance of 100 to 5000 mm/min, the exposure time is below one minute, usually in the region of a few seconds. Under these conditions, the concentration of the radicals generated by absorption of light in the exposed regions of the photopolymerizable layer is higher by orders of magnitude than in the case of tube exposure. The chain initiation reaction is very much quicker than the chain termination reaction. The oxygen that is present in or diffuses subsequently into the photopolymerizable layer is no longer able to exert any substantial influence over photopolymerization. The halftone dots are therefore imaged exactly to the boundary with the unexposed region. Halftone dots with sharp edges are produced. The skilled person refers to flat-top dots (FTDs).

In accordance with the invention, exposure takes place in such a way that FTD halftone dots are produced. The chain initiation reaction is very much quicker than the oxygen-mediated chain termination reaction. Nevertheless, the presence of oxygen and its subsequent diffusion still play a considerable part at the boundary between exposed and unexposed regions of the printing plate.

Without being tied to any particular theory, it is thought that there is a further effect to be considered under UV-LED exposure conditions. As a result of the high exposure intensity, there is a sudden depletion of crosslinker in the exposed regions of the printing plate. The reaction subsequently proceeds under diffusion control, and is fed by diffusion of the crosslinker from the adjacent, unexposed regions. The diffusion of the crosslinker, however, is comparatively slow, and therefore acts only in a narrow region around the boundary between image and nonimage regions. From the investigations presently carried out, it can be concluded that diffusion effects play a key part only at a distance of a few μm (10 to 100 μm) around the exposed regions. As a result of the diffusion of the crosslinker, at the boundary between unexposed and exposed regions of the printing plate, there is significant transport of material, which substantially determines the shape of the halftone dot and in particular the edges of the halftone dot. The phenomenon of the formation of measurable edges at the boundaries of the image elements is known to the skilled person. It is referred to as cupping. The correlation of the phenomenon of cupping with the diffusion of the crosslinker in the photopolymerizable layer has not hitherto been acknowledged, however.

Accordingly, in the exposure of flexographic printing plates with high-energy UV-LED radiation, there is competition between processes of (1) light absorption and radical formation, (2) polymerization, (3) diffusion of oxygen into the photopolymerizable layer and chain termination, and (4) diffusion of the crosslinker in the photopolymerizable layer, and the interplay of these processes determines the shape of the relief elements and hence also their printing characteristics.

The luminous intensity at the level of the surface of the flexographic printing element is measured using a suitable, calibrated UV measuring device, the sensor of the measuring device being placed at the same distance from the radiation source as the plate surface would be from the radiation source. Suitable UV measuring devices are available commercially from a variety of suppliers. Important factors here are that the measuring device is calibrated and sensitive within the UV wavelength range under test.

When producing cylindrical flexographic printing plates, it is also possible to use what are called round exposure systems, which then comprise one or more LED arrays.

Generally speaking, the flexographic printing element is subjected to preliminary exposure from the reverse. For this purpose, before step (b) is performed, the layer of photopolymerizable material is pre-exposed with actinic light through the UV-transparent support film, from the reverse of the photopolymerizable flexographic printing element. Preliminary reverse exposure is carried out preferably in the case of flexographic printing elements having a thickness of ≥1 mm, this figure relating to the sum total of dimensionally stable support film and photopolymerizable layer.

Generally speaking, preliminary reverse exposure takes place using a UV tube or another UV source.

The photopolymerizable flexographic printing element used as starting material comprises—arranged atop one another at least
 a dimensionally stable support, and
 at least one photopolymerizable, relief-forming layer, at least comprising an elastomeric binder, an ethylenically unsaturated compound, and a photoinitiator,
 a layer imagable digitally by laser ablation.

Examples of suitable dimensionally stable supports for the photopolymerizable flexographic printing elements used as starting material for the method are sheets, films, and also conical and cylindrical sleeves made of metals such as steel, aluminium, copper, or nickel, or of plastics such as polyethylene terephthalate (PET), polyethylene naphthalate (PEN), polybutylene terephthalate (PBT), polyamide, polycarbonate, optionally also woven and nonwoven fabrics, such as woven glass fibre fabric, and also composite materials, comprising glass fibres and plastics for example. Dimensionally stable supports contemplated include, in particular, dimensionally stable support films such as, for example, polyester films, more particularly PET or PEN films, or flexible metallic supports, such as thin sheets or metal foils made of steel, preferably of stainless steel, magnetizable sprung steel, aluminium, zinc, magnesium, nickel, chromium, or copper.

If preliminary reverse exposure of the flexographic printing element is to be carried out, the dimensionally stable support must be transparent to UV light. Preferred supports are plastics films made from PET or other polyesters.

The flexographic printing element further comprises at least one photopolymerizable, relief-forming layer. The photopolymerizable, relief-forming layer may be applied directly on the support. Between the support and the relief-forming layer, however, there may also be other layers, such as adhesion layers and/or resilient underlayers.

Between the support film, optionally coated with an adhesion layer, and the photopolymerizable, relief-forming layer there may be an elastomeric support layer. The support layer may optionally be compressible or photochemically crosslinkable.

The photopolymerizable, relief-forming layer comprises at least one elastomeric binder, an ethylenically unsaturated compound, a photoinitiator or a photoinitiator system, and also, optionally, one or more further components, examples being plasticizers, processing assistants, dyes, and UV absorbers.

Elastomeric binders for producing flexographic printing elements are known to the skilled person. Both hydrophilic and hydrophobic binders may be used. Examples include styrene-diene block copolymers, ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, or ethylene-propylene-diene rubber (EPDM). It is preferred to use hydrophobic binders. Binders of this kind are soluble or at least swellable in organic solvents, whereas in water they are largely insoluble and are also not swellable, or at least not substantially swellable, in water.

The elastomer is preferably a thermoplastically elastomeric block copolymer of alkenylaromatics and 1,3-dienes. The block copolymers may be linear, branched, or radial block copolymers. Typically they are triblock copolymers of the A-B-A type, but may also be diblock polymers of the A-B type, or copolymers having two or more alternating elastomeric and thermoplastic blocks, e.g., A-B-A-B-A. Use may also be made of mixtures of two or more different block copolymers. Commercial triblock copolymers frequently include certain fractions of diblock copolymers. The diene units may be 1,2- or 1,4-linked. Not only block copolymers of the styrene-butadiene or styrene-isoprene type but also those of the styrene-butadiene-isoprene type may be used. They are available commercially under the name Kraton®, for example. Additionally it is possible as well to use thermoplastically elastomeric block copolymers having end blocks of styrene and a random styrene-butadiene middle block, these copolymers being available under the name Styroflex®. The block copolymers may also be wholly or partly hydrogenated, such as in SEBS rubbers, for example.

Elastomeric binders present very preferably in the photopolymerizable, relief-forming layer are triblock copolymers of the A-B-A type or radial block copolymers of the $(AB)_n$ type, in which A is styrene and B is a diene.

Elastomeric binders present very preferably in an elastomeric support layer are triblock copolymers of the A-B-A type, radial block copolymers of the $(AB)_n$ type, in which A is styrene and B is a diene, and also random copolymers and statistical copolymers of styrene and of a diene.

It is of course also possible to use mixtures of two or more binders, subject to the proviso that this does not adversely affect the properties of the relief-forming layer.

The total amount of binders in the case of the relief-forming layer is typically 40% to 90% by weight, relative to the sum of all of the constituents of the relief-forming layer, preferably 40% to 80% by weight, and more preferably 45% to 75% by weight.

In the case of an optionally present elastomeric support layer, the total amount of elastomeric binders may be up to 100% by weight. Typically it is 75% to 100% by weight, preferably 85% to 100% by weight, and more preferably 90% to 100% by weight.

The photopolymerizable, relief-forming layer further comprises, in a known way, at least one ethylenically unsaturated compound which is compatible with the binders. Suitable compounds have at least one ethylenically unsaturated double bond and are polymerizable. They are therefore referred to below as monomers. Having proven particularly advantageous are esters or amides of acrylic acid or of methacrylic acid with mono- or polyfunctional alcohols, amines, amino alcohols or hydroxyl ethers and hydroxyl esters, esters of fumaric or maleic acid, vinyl ethers, vinyl esters, or allyl compounds. Examples of suitable monomers are butyl acrylate, 2-ethylhexyl acrylate, lauryl acrylate, tetradecyl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate, and N-dodecylmaleimide. Very preferred monomers are mono-, di-, and tri-acrylates and -methacrylates. It is of course also possible to use mixtures of two or more different monomers. The nature and amount of the monomers are selected by the skilled person according to the desired properties of the layer. The amount of monomers in the photopolymerizable, relief-forming layer a) is generally not more than 20% by weight, relative to the amount of all constituents, and in general is between 3% and 15% by weight.

In a way which is known in principle, the photopolymerizable, relief-forming layer further comprises at least one photoinitiator or a photoinitiator system. Examples of suitable initiators are benzoin or benzoin derivatives, such as methylbenzoin or benzoin ethers, benzil derivatives, such as benzil ketals, acylarylphosphine oxides, acylarylphosphinic esters, α-hydroxy ketones, polycyclic quinones, or benzophenones. The amount of photoinitiator in the relief-forming layer is generally 0.1% to 5% by weight, relative to the amount of all of the constituents of the relief-forming layer.

The elastomeric support layer may likewise comprise the aforementioned ethylenically unsaturated compounds and the aforementioned photoinitiators, and preferably does comprise them, and is therefore photopolymerizable like the relief-forming layer. Generally speaking, the amount of ethylenically unsaturated compounds in the support layer is 0% to 15% by weight. In general the amount of photoinitiator in the support layer is 0% to 5% by weight.

The relief-forming layer and optionally the optional elastomeric support layer may comprise plasticizers. Mixtures of different plasticizers can be used as well. Examples of suitable plasticizers include modified and unmodified natural oils and natural resins, such as high-boiling paraffinic, naphthenic, or aromatic mineral oils, synthetic oligomers or resins such as oligostyrene, high-boiling esters, oligomeric styrene-butadiene copolymers, oligomeric α-methylstyrene/p-methylstyrene copolymers, liquid oligobutadienes, more particularly those having a molecular weight of between 500 and 5000 g/mol, or liquid oligomeric acrylonitrile-butadiene copolymers or oligomeric ethylene-propylene-diene copolymers. Preference is given to polybutadiene oils, more particularly those having a molecular weight of between 500 and 5000 g/mol, high-boiling aliphatic esters such as, more particularly, esters of alkylmonocarboxylic and dicarboxylic acids, examples being stearates or adipates, and mineral oils. The amount of an optionally present plasticizer is determined by the skilled person in accordance with the desired properties of the layer. In general it will not exceed 50% by weight of the sum total of all of the constituents of the photopolymerizable, relief-forming layer; in general it is 0% to 50% by weight, preferably 0% to 40% by weight.

The thickness of the relief-forming layer is generally 0.3 to 7 mm, preferably 0.5 to 6 mm.

One preferred embodiment uses a binder of the styrene-butadiene type. Particularly preferred binders are linear, radial, or branched block copolymers of the styrene-butadiene type. These block copolymers have an average molecular weight $M_w$ (weight average) of 80 000 to 250 000 g/mol, preferably 80 000 to 150 000 g/mol, and more preferably of 90 000 to 130 000 g/mol, and have a styrene content of 20% to 40% by weight, preferably 20% to 35% by weight, and more preferably of 20% to 30% by weight.

In another preferred embodiment of the invention, the binder is of the styrene-isoprene type. Preferred binders of the styrene-isoprene type contain generally 13% to 40%, preferably 13% to 35%, and more preferably from 14% to 30% by weight of styrene.

The photopolymerizable flexographic printing elements can be produced by methods known in principle to the skilled person, as for example by melt extrusion, casting or laminating in a single stage or multistage production procedure. Preference is given to their production by means of melt extrusion, where first of all the constituents of the relief-forming layer are mixed with one another in an extruder, with heating. For producing sheetlike flexographic printing elements, the photopolymerizable composition can be discharged from the extruder through a slot die between two films, and the layer assembly can be calendered, the nature of the films being guided by the desired end use. The films in question are films which exhibit good adhesion to the photopolymerizable layer, or are readily removable (temporary) films. For the production of sheetlike flexographic printing elements it is usual to use a well-adhering support film and a removable cover film. The thickness of the photopolymerizable layer is generally 0.4 to 7 mm, preferably 0.5 to 4 mm, and more preferably 0.7 to 2.5 mm.

The imaging of the digitally imagable layer is performed by means of digital masks. Masks of this kind are also known as in situ masks. For this purpose, a digitally imagable layer is first applied to the photopolymerizable, relief-forming layer. The digitally imagable layer is preferably an IR-ablative layer, inkjet layer or layer which can be written thermographically.

The digitally imagable layer is preferably a layer which can be ablated using an IR laser (IR-ablative layer).

IR-ablative layers and masks are opaque to the wavelength of actinic light and typically comprise at least one binder, an IR absorber such as carbon black, for example, and also an absorber for UV radiation; the function of the IR absorber and UV absorber may also be performed by just one substance, as is the case, for example, when carbon black is used as IR absorber, since in sufficient concentration carbon black renders the mask layer substantially opaque to UV light. A mask can be written into the IR-ablative layer by means of an IR laser—in other words, at the points at which it is struck by the laser beam, the layer is decomposed and ablated. Irradiation can take place imagewise with actinic light through the resultant mask. Examples of the imaging of flexographic printing elements with IR-ablative masks are disclosed in EP-A 654 150 or EP-A 1 069 475, for example.

In the case of inkjet layers, a layer which can be written with inkjet inks, such as a gelatin layer, is applied. This layer is imagable by means of inkjet printers. Examples are disclosed in EP-A 1 072 953.

Thermographic layers are layers comprising substances which turn black in colour under the influence of heat.

Layers of this kind comprise, for example, a binder and an organic silver salt, and can be imaged by means of a printer with a thermal head or by means of IR lasers. Examples are disclosed in EP-A 1 070 989.

The method of the invention can be carried out by inserting the starting material first into a receiving unit, by means, for example, of placing it onto a conveyor belt or charging the magazine. If the starting material has a protective cover sheet, then, unless the receiving unit has an automatic removal means, said sheet must be removed.

In the method step (a), the digitally imagable layer is imaged in an imaging unit by means of the technology requisite in each case. The image information is taken directly from a control unit.

In the method step (b), the imaged flexographic printing element is irradiated by means of the exposure unit through the mask that has been produced, using actinic light—that is, chemically active light.

In a method step (c), the imagewisely imaged and exposed flexographic printing element is developed by means of a suitable solvent or solvent combination. In this case the unexposed regions, i.e., those covered by the mask, in the relief layer are removed, while the exposed—i.e., cross-linked—regions are retained. Moreover, the remainders of the digitally imagable layer are removed.

The solvent or solvent mixture used is guided by the nature of the flexographic printing element employed. If the flexographic printing element has an aqueously developable photopolymerizable layer, then water or predominantly aqueous solvents can be used. In the case of organically developable flexographic printing elements, particular suitability is possessed by the known washing agents for flexographic printing plates, consisting typically of mixtures of different organic solvents which interact in an appropriate way. For example, use may be made of developers comprising naphthenic or aromatic petroleum fractions in a mixture with alcohols, such as benzyl alcohol, cyclohexanol, or aliphatic alcohols having 5 to 10 carbon atoms, for example, and also, optionally, further components, such as, for example, alicyclic hydrocarbons, terpenoid hydrocarbons, substituted benzenes such as diisopropylbenzene, esters having 5 to 12 carbon atoms, or glycol ethers, for example. Suitable washing agents are disclosed in EP-A 332 070 or EP-A 433 374, for example.

The developing step is carried out typically at temperatures above 20° C. For reasons of safety and to reduce the cost and complexity of the developing apparatus involved, the temperature when using organic solvents ought to be 5° C. to 15° C. beneath the flash point of the washing agent mixture used.

The flexographic printing plates can be dried in a method step (d). Where the flexographic printing element has a PET film support, drying takes place preferably at a temperature of 40 to 80° C., more preferably at 50 to 70° C. Where the dimensionally stable support of the flexographic printing element is a metal support, drying may also take place at higher temperatures, up to around 160° C.

In a method step (e), the resultant flexographic printing plates may where necessary be subjected additionally to a detackifying aftertreatment by means of UVA and/or UVC light. Generally speaking, such a step is advisable. If irradiation is to take place with light of different wavelengths, this may occur simultaneously or else in succession.

Between the individual method steps, the flexographic printing element or flexographic printing plate is transported on from one unit to the next.

Development may also be accomplished by thermal means. In the case of thermal development, no solvent is used. Instead, following imagewise exposure, the relief-forming layer is brought into contact with an absorbing material and heated. The absorbing material comprises, for example, a porous nonwoven, made of nylon, polyester, cellulose, or inorganic materials, for example. In the course of the thermal development, the flexographic printing element, at least on the surface, experiences an increase in temperature such that the unpolymerized fractions of the relief-forming layer are able to turn liquid and be taken up by the absorbing material. The used absorbing material is then removed. Details relating to thermal development are disclosed by U.S. Pat. No. 3,264,103, U.S. Pat. No. 5,175, 072, WO 96/14603, or WO 01/88615, for example. The mask may optionally be removed beforehand by means of a suitable solvent or likewise thermally.

The invention is illustrated by the examples which follow.

EXAMPLES

Metrological Determination of Raised Edges

Quantitating the raised edges of the image elements on a flexographic printing plate, especially those of individual halftone dots, is not a trivial matter. The edges are just a few µm high and are difficult to determine by optical methods.

A simple and rapid method for measuring the geometry of halftone dot surfaces is that of mechanical surface sensing by means of a diamond sensor, which is fastened to a movable arm and whose deflection is measured and converted into a surface profile (Perthometer measurement). In order to ensure reproducibility of the results of the measurement, all of the measurements are carried out on the same halftone field (tonal value 40%, line width 89 LPI) under identical measurement conditions.

The measurements are carried out using a MarSurf M400 set from Mahr, with an SD26 advancer and a BFW-250 sensing system, using a measuring force of 0.7 mN over a measuring distance of 5 mm. With this measuring distance, the speed is 0.5 mm/s and 10 000 data points are recorded.

FIG. 1 shows a typical Perthometer measurement result for a plate with pronounced raised edges, i.e. pronounced cupping. This is a nyloflex ACE 114 D plate, exposed in one pass with a slow speed of 65 mm/min by means of UV-LED exposure.

Figure 2:
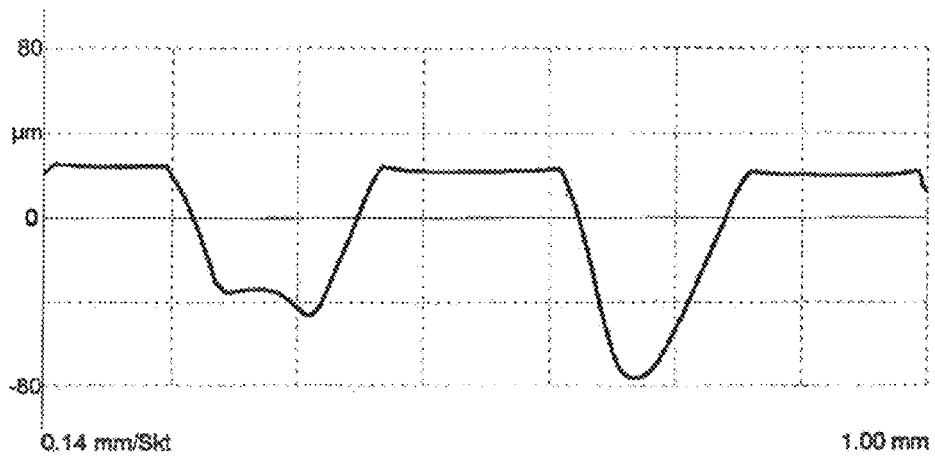
FIG. 2 shows the result of the Perthometer measurement for an inventively produced plate with minimal cupping.

For comparison, FIG. 2 shows the same measurement result for a nyloflex ACE 114 D plate exposed in 60 passes with a speed of 4000 mm/min by means of UV-LED. Here, the edges of the halftone dots are barely visible. Cupping is only minimal.

Figure 3:
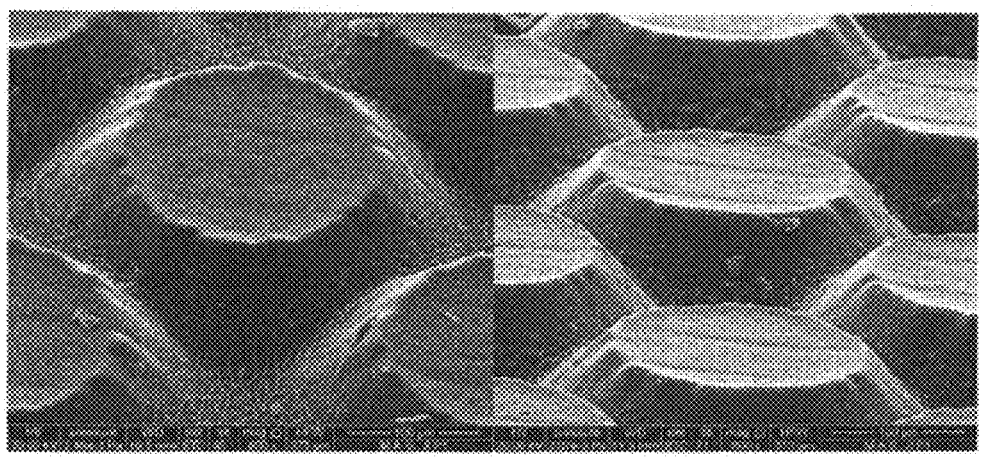
FIG. 3 shows an electron micrograph of halftone dots with pronounced cupping.
Figure 4:
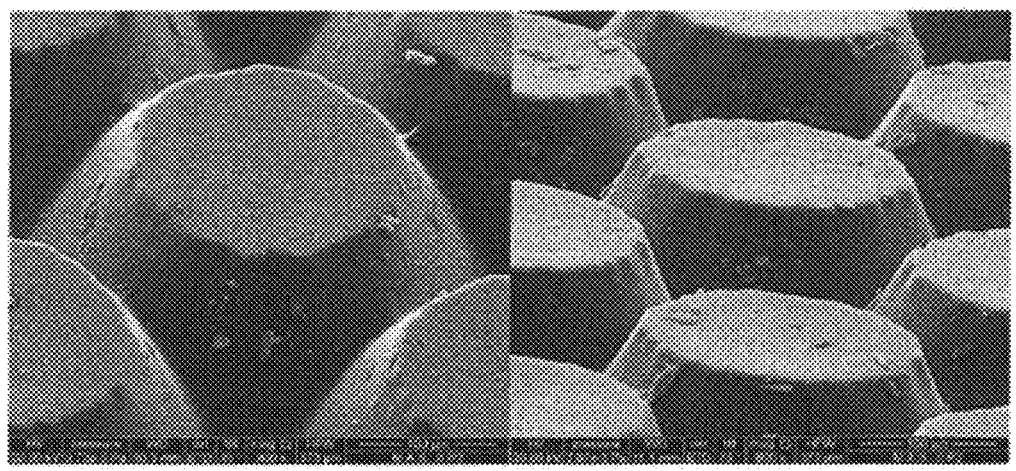
FIG. 4 shows an electron micrograph of halftone dots with inventively minimal cupping.

The Perthometer results were verified by electron micrographs. FIG. 3 shows electron micrographs of the plate exposed with UV-LED in one pass. FIG. 4 shows the corresponding micrographs for the plate exposed in 60 rapid passes with UV-LED. The electron micrographs impressively confirm the results of the Perthometer measurements.

For quantitative determination of cupping or of the height of the halftone dot edges, the Perthometer measurement is evaluated as described below. The halftone dots have a target diameter of 300 µm. In order to rule out measurement artefacts arising from measuring needle overshoot, only the right-hand (trailing) edge of the halftone dot is measured in each case. The height of the edge is given by the difference between the highest value (measured directly at the edge) and the measurement value measured in each case at a distance of 30 μm from the edge of the halftone dot. Typical cupping values on flexographic printing plates are between 0 and 10 μm.

Processing of the Photopolymerizable Flexographic Printing Elements into the Plate The energy input per partial exposure (exposure cycle) into the printing plate varies from 0.1 to 5 J/cm$^2$. The corresponding running speeds are varied from 50 mm/min to 5000 mm/min. When using a commercially available UV-LED device (nyloflex NExT FV exposure unit from Flint Group) in large format (1320×2032 mm), the cycle times with the running speeds indicated are from several seconds to a few minutes.

The printing plate used was the nyloflex NEF 114 D flexographic printing plate from Flint Group, developed especially for exposure with UV-LED light.

Processing of the flexographic printing elements encompassed the following steps:
- removal of the cover film
- imaging by IR laser (CDI Spark 4835 from Esko Graphics, high-resolution Pixel+ optical system, 4000 dpi mask resolution)
- reverse exposure on nyloflex Fill tube exposure unit (16 sec)
- UV-LED exposure as per Table 1
- washing in nylosolv A in a nyloflex Fill washer (255 mm/min)
- drying (2 hours at 60° C.)
- aftertreatment with light (10 minutes with UVA light, 1 minute with UVC light).

After the cover film had been removed, the flexographic printing plates were mounted on the drum of the IR laser. The test motif (shown in FIG. 5) was subsequently written into the mask layer, using a laser energy of 3.0 J/cm$^2$. Thereafter the plates were subjected to preliminary reverse exposure, after which they were given main exposure by UV LED irradiation.

The UV-LED exposures were carried out on the large-format nyloflex NExT FV exposure unit from Flint Group. This unit is designed for plate formats of up to 1320 mm×2032 mm. Each printing plate was exposed as if a large-format plate were being exposed; in other words, the entire length of the exposure unit was travelled by the UV-LED strip.

The UV-LED strip of the nyloflex NExT FV exposure unit is 9 mm wide. The UV light is emitted at an angle of 30°. The distance of the LED strip from the plate was 10 mm, giving an irradiation width of 20.5 mm. The power of the exposure unit was set at 80% of maximum power, corresponding to 650 mW/cm$^2$.

Exposures were carried out with the following settings:

TABLE 1

| Experiment number | Exposure setting | Energy input/cycle | Total time (min) |
|---|---|---|---|
| VV1 | 1 × 80 mm/min | 1 × 10 J/cm$^2$ | 25.8 |
| V1 | 3 × 250 mm/min | 3 × 3.2 J/cm$^2$ | 25.6 |
| V2 | 1 × 200 mm/min + 30 × 4000 mm/min | 1 × 4.0 J/cm$^2$ + 30 × 0.2 J/cm$^2$ | 38.0 |
| V3 | 30 × 4000 mm/min + 1 × 200 mm/min | 30 × 0.2 J/cm$^2$ + 1 × 4.0 J/cm$^2$ | 38.0 |
| V4 | 50 × 4000 mm/min | 50 × 0.2 J/cm$^2$ | 45.7 |
| V5 | 20 × 4000 mm/min + 2 × 1000 mm/min + 1 × 200 mm/min | 20 × 0.2 J/cm$^2$ + 2 × 0.8 J/cm$^2$ + 1 × 4.0 J/cm$^2$ | 33.7 |

TABLE 1-continued

| Experiment number | Exposure setting | Energy input/cycle | Total time (min) |
|---|---|---|---|
| V6 | As V5, exposed only in forward and back running | As V5 | 24.8 |

The exposure settings were selected in each case so that the overall energy input was about 10 J/cm$^2$ in each case. As a result of the large-format operation, the exposure times are relatively long and are between 25 and 45 minutes. Unless otherwise noted, the LED strip was switched off on being run back into the starting position. Particularly in the case of experiment V4, this results in a very long exposure time.

In V1, exposure was divided into 3 identical exposure cycles.

In V2 and V3, a slow pass was combined with 30 quick passes in each case. In V4, only quick runs were realized, and in V5 the exposure speed was reduced from a high speed via a medium speed to a low speed. In V6 the exposure speeds were as in V5, but the LED strip was run back and forth without being switched off, resulting in a significantly shorter overall exposure time.

Plate Evaluation

The plates produced were comprehensively evaluated.

TABLE 2

| Experiment number | Hardness (Micro ShoreA) | First halftone field (124 lpi) | Depth of 200 μm neg. dot (μm) | Cupping (μm) |
|---|---|---|---|---|
| VV1 | 61 | 2.0 | 60 | 5.7 |
| V1 | 60 | 1.6 | 70 | 2.8 |
| V2 | 59 | 2.0 | 70 | 3.2 |
| V3 | 60 | 2.4 | 130 | 2.3 |
| V4 | 59 | 3.2 | 130 | 2.3 |
| V5 | 60 | 2.0 | 135 | 2.3 |
| V6 | 59 | 2.0 | 130 | 2.3 |

The hardness of all the plates, at 60+/−1, was within the target range.

All of the plates had halftone dots with flat, sharply bordered surfaces (flat-top dots). The first, well-anchored halftone field on the plates did not, surprisingly, exhibit particularly sharp variation, and was around 2%. Only the exposure setting of experiment V4, with a figure of 3.2% tonal value, dropped off slightly. For comparison: with a line width of 124 lpi, a flexographic printing plate exposed using UVA tubes is usually able to hold only a tonal value of between 6% and 8% on the plate.

A remarkable feature was the effect of the exposure setting on the cupping and the depth of the 200 μm negative dot. Like the comparative experiment, the experimental settings V1 and V2 yielded low depth values. These exposure settings were characterized by a slow movement or by a slow movement as first exposure pass. Experiment V3, in which a slow pass takes place only at the end of exposure, again shows very good (high) inter-dot depths, like the other inventive experiments.

The cupping of the halftone dots of the printing relief shows a similar dependency. The three experimental settings with a slow movement or with a slow movement of the UV-LED strip at the beginning of exposure exhibit significantly higher edges than the other experimental settings.

A possible interpretation of these results is that at the start of exposure there is still a high concentration of crosslinker present in the printing plate. If a high energy input is applied at the start of exposure, corresponding to a slow movement of the UV-LED strip, the result is a significant monomer flow, which first causes the formation of raised edges at the boundaries between exposed and unexposed regions and which secondly—again at the boundary between exposed and unexposed regions of the printing plate—results in a reduction in the depth of the negative dots as a result of polymerization. For each volume element of the photopolymerizable layers, the effects of the competing reactions of radical formation, polymerization, termination caused by oxygen, and diffusion of the crosslinker are different. At the surface of the flexographic printing plate, the subsequent diffusion of the oxygen is still significant, and prevents polymerization growing beyond the boundary between exposed and unexposed regions into the unexposed region. Here it is monomer diffusion that determines the generation of the typical raised edges. At a distance of around 100 μm from the surface (in the region of the depth of a fine negative dot) oxygen no longer plays a part. The oxygen does not diffuse to a sufficient depth into the photopolymerizable layer in order to inhibit polymerization in non-image regions. With high energy doses per exposure step and with a correspondingly high concentration of free radicals, these radicals diffuse to an increased extent into the non-image regions, thereby reducing the depths between the image dots as a result of polymerization.

If a cycle with high energy input (by slow movement of the UV LED strip) is carried out not until the end of exposure, then some of the crosslinker (monomer) has already been consumed, and there is no longer a significant flow of monomer, in spite of high energy input. The depths between the image dots remain open and the edges of the halftone dots are no longer so strongly pronounced.

Printing Experiments

The plates were subsequently used for printing on a flexographic printing machine, under identical conditions, and the resulting prints were evaluated.

Printing parameters

Printing machine: W&H central cylinder machine

Printing ink: Flexistar Cyan alcohol-based flexographic printing ink

Adhesive tape: Lohmann 5.3

Printing speed: 100 m/min

Print setting: optimal (+70 μm via kissprint setting; kissprint is the name for the setting at which around half of all image elements are printed out. Here, the printing cylinder just makes contact between the substrate and the plate surface, without exerting substantial pressure.)

TABLE 3

| Experiment number | Tonal value of first halftone field (124 lpi) | Log. colour density (MG34) | Dot bridging | Characteristic printing line | Assessment of print quality |
|---|---|---|---|---|---|
| VV1 | 17.6 | 1.67 | strong | inconsistent | poor |
| V1 | 15.4 | 1.69 | low | consistent | good |
| V2 | 20.1 | 1.67 | low | consistent | good |
| V3 | 18.6 | 1.63 | none | consistent | very good |
| V4 | 20.4 | 1.59 | none | consistent | good |
| V5 | 17.0 | 1.65 | none | consistent | very good |
| V6 | 18.3 | 1.63 | none | consistent | very good |

Figure 5:
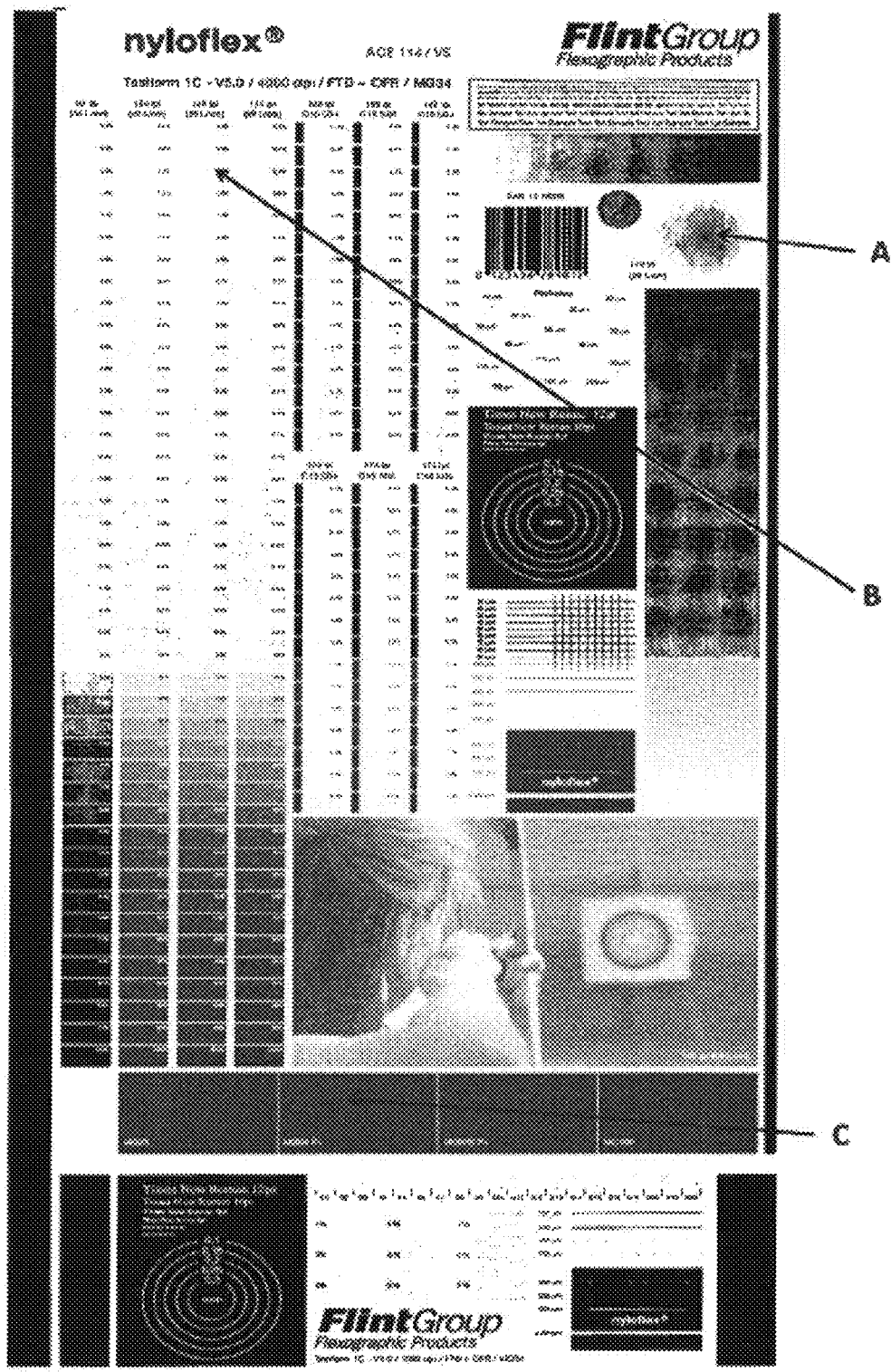
FIG. 5 shows the text motif printed in the printing experiments.

The sensitive test element printed for the incidence of dot bridging was a circular halftone pattern (motif A in FIG. 5). Furthermore, the tonal value of the first printing halftone field (motif B) and the corresponding characteristic tonal value line (see FIG. 6) were ascertained in each case. The colour density of the surface-structured full area (selected surface halftone MG 34, motif C) was determined by densitometry. Furthermore, the entire printed image was assessed for contrast, sharpness of detail and ink laydown by a number of testers, and classified in one of the categories (very good, good, poor).

All the plates printed the first halftone tonal value with an area coverage of between 15% and 20%, which is customary for FTD plates with a halftone width of 124 lpi. Likewise, all of the prints display a high colour density in the region of the full area structured by means of surface halftones. The unstructured surface, in contrast, brings an average colour density of only 1.5+/−0.05.

Figure 6:
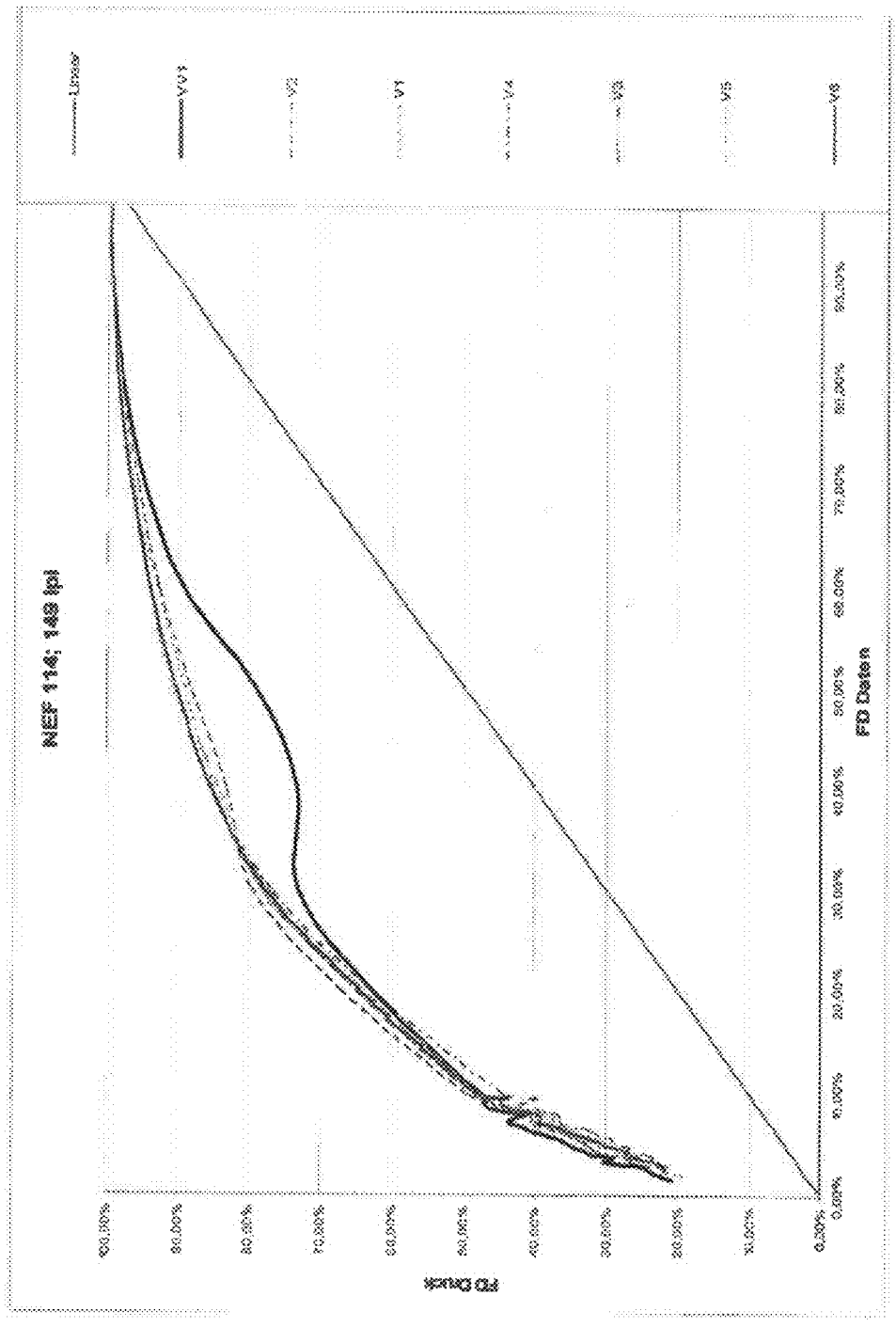
FIG. 6 shows the characteristic printing lines for print experiments VV1 and V1 to V6.
Figure 7:
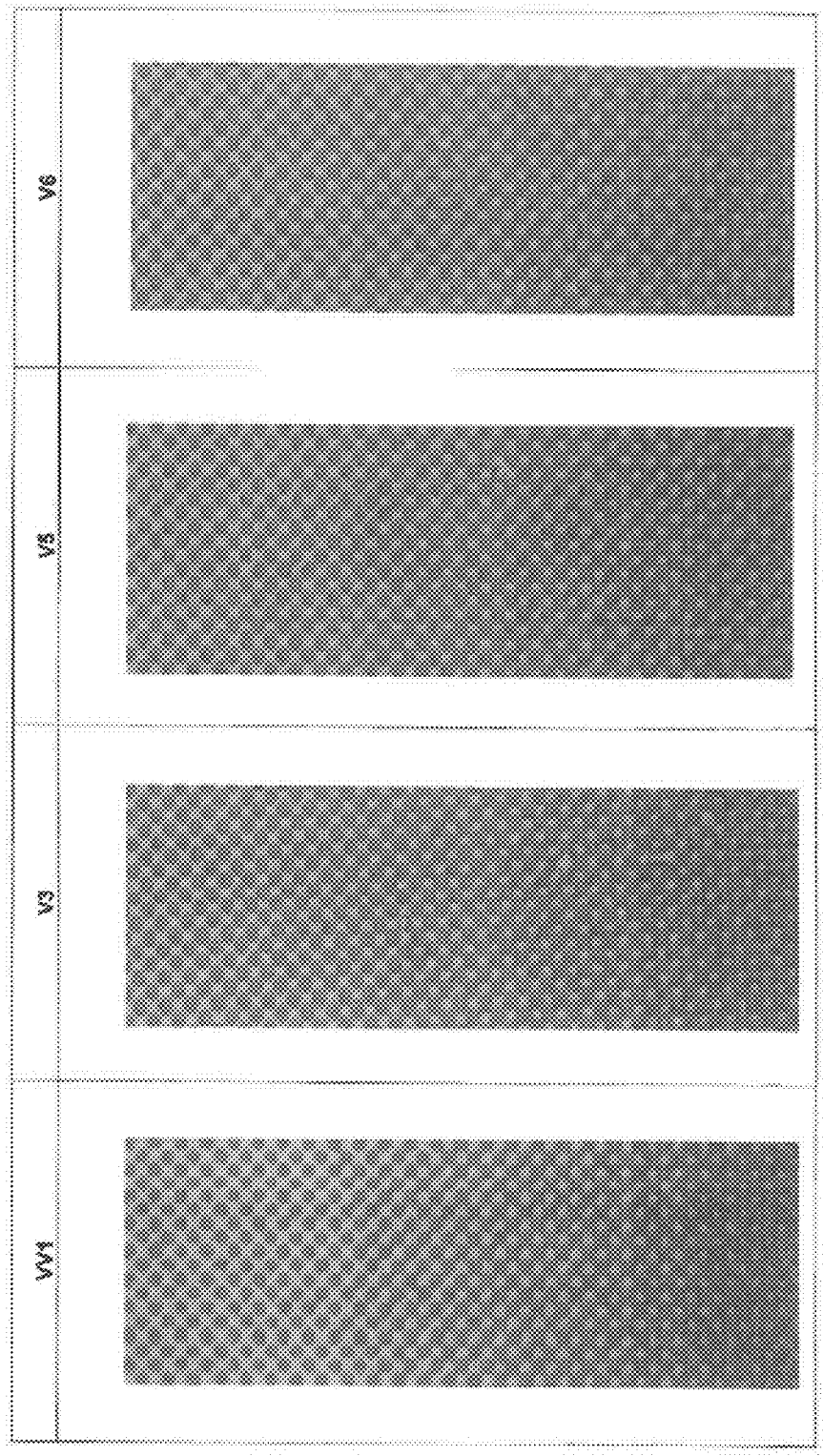
FIG. 7 shows enlarged photographs of dot patterns for printing experiments VV1, V3, V5 and V6.

The problem of ink bridging at moderate tonal values of 30% to 60% is visible from the characteristic printing line and in the print of the circular halftone (motif A). FIG. 6 shows the characteristic printing lines associated with experiments VV1 and V1 to V6. In a characteristic printing line, halftone fields are printed with different area coverages, and evaluated. The area coverage of ink in the print (measured by densitometry in comparison with the optical density of the full area—in percent) is contrasted with the theoretical area coverage of the data set. As a result of squeezing of the printing ink, the area coverage in the print is higher than the theoretically calculated printing surface. Consequently, characteristic printing lines in flexographic printing display a typical convex curvature over the diagonal in the diagram. In order to represent halftoned images it is necessary for this curvature to be reproducible and consistent. Inconsistencies in the characteristic printing line are indicative of problems which render halftone reproduction impossible. FIG. 7 shows photographs of enlarged pictures of the halftone dots of the circular halftone for printing experiments VV1, V3, V5 and V6.

In comparative experiment VV1, ink bridging is apparent even at low tonal values in the micrograph, although the halftone dots are at a sufficient distance from one another and ought not to have any contact with one another. The other exposure settings show no ink bridges. Even with larger halftone dots, almost in contact with one another, each individual dot still printed out with clean separation.

In a comparison of the characteristic printing lines as well, comparative experiment VV1 scores poorly. In the region of the middle tonal values, the characteristic printing line falls off, and shows an almost horizontal behaviour in the region from 30% to 50%. This dent in the characteristic printing line is extremely strongly pronounced for comparative experiment VV1. All other exposure settings show a continuously rising, consistent characteristic printing line.

The printing results correlate with the evaluations of the plates. Plates with pronounced cupping and inadequate depths between the image dots tend, logically, to form ink bridges in high-quality halftone printing. On contact with the substrate, the low-viscosity printing ink is squeezed out over the edges of the halftone dot. The printing ink runs into the flat depths between the halftone dots, where it dries. In the next printing pass, the process is repeated, until eventually a printing ink bridge is produced.

The experiments demonstrate forcefully that the exposure settings which allow the formation of raised edges to be prevented and which allow sufficiently great depths between image dots to be obtained also permit the best print outcomes. Exposure settings V3, V5 and V6 in particular, in which first of all a number of exposures with a low energy input (rapid movement of the UV-LED strip) are performed, and then, at the end of exposure, one or more exposures with a higher energy input (slower movement of the UV-LED strip) are realized, score the best in terms of print quality. V6, furthermore, realizes an optimum print quality with a short exposure time.

The invention claimed is:

1. A method for producing flexographic printing plates, using as starting material a photopolymerizable flexographic printing element which at least comprises, arranged one atop another, a dimensionally stable support, and at least one photopolymerizable, relief-forming layer, at least comprising an elastomeric binding, an ethylenically unsaturated compound, and a photoinitiator, a digitally imagable layer, and the method comprises at least the following steps:

(d) producing a mask by imaging the digitally imagable layer, (e) exposing the photopolymerizable, relief-forming layer through the mask with actinic light, and photopolymerizing the image regions of the layer, and (f) developing the photopolymerized layer by washing out the unphotopolymerized regions of the relief-forming layer with an organic solvent, or by thermal development, wherein step (b) comprises two or more exposure cycles (b 1) to (b n) with actinic light with an intensity of 100 to 5000 mW/cm$^2$ from a plurality of UV-LEDs, the energy input into the photopolymerizable, relief-forming layer per exposure cycle being 0.1 to 5 J/cm$^2$.

2. The method according to claim 1, wherein the total energy input into the photopolymerizable, relief-forming layer in step (b) is 5 to 25 J/cm$^2$.

3. The method according to claim 1, wherein the energy input per exposure cycle increases over exposure step (b).

4. The method according to claim 1, wherein the exposure step (b) is carried out by relative movement of the plurality of UV-LEDs parallel to the surface of the flexographic printing element.

5. The method according to claim 4, wherein the plurality of UV-LEDs are arranged alongside one another on at least one UV-LED strip which is moved along the surface of the flexographic printing element.

6. The method according to claim 4, wherein the plurality of UV-LEDs are arranged alongside one another on at least two UV-LED strips, of which at least one is mobile and at least one is fixed.

7. The method according to claim 4, wherein the UV-LED strip or the UV-LED strips are moved with a speed of 50 to 5000 mm/min relative to the surface of the flexographic printing element.

8. The method according to claim 1, wherein the UV-LEDs used in step (b) have an emission maximum in the wavelength range of 350 to 405 nm.

9. The method according to claim 8, wherein the UV-LEDs used in step (b) have an emission maximum at 350 nm, 365 nm, 375 nm, 385 nm, 395 nm or 405 nm.

10. The method according to claim 1, wherein the digitally imagable layer is a laser-ablatable layer.

11. The method according to claim 1, wherein the distance of the UV-LEDs from the surface of the flexographic printing element is 5 to 30 mm.

* * * * *